US011282676B2

United States Patent
Ponnekanti et al.

(10) Patent No.: US 11,282,676 B2
(45) Date of Patent: Mar. 22, 2022

(54) PAIRED DYNAMIC PARALLEL PLATE CAPACITIVELY COUPLED PLASMAS

(71) Applicant: Applied Materials, Inc., Santa Clara, CA (US)

(72) Inventors: Hari Ponnekanti, San Jose, CA (US); Tsutomu Tanaka, Santa Clara, CA (US); Mandyam Sriram, San Jose, CA (US); Dmitry A. Dzilno, Sunnyvale, CA (US); Sanjeev Baluja, Campbell, CA (US); Mario D. Silvetti, Morgan Hill, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 188 days.

(21) Appl. No.: 16/444,549

(22) Filed: Jun. 18, 2019

(65) Prior Publication Data

US 2019/0385819 A1 Dec. 19, 2019

Related U.S. Application Data

(60) Provisional application No. 62/686,643, filed on Jun. 18, 2018.

(51) Int. Cl.
*H01J 37/32* (2006.01)
*H01L 21/02* (2006.01)
*C23C 16/455* (2006.01)
*C23C 16/46* (2006.01)

(52) U.S. Cl.
CPC .. *H01J 37/32091* (2013.01); *C23C 16/45536* (2013.01); *C23C 16/45544* (2013.01); *C23C 16/46* (2013.01); *H01J 37/32568* (2013.01); *H01J 37/32715* (2013.01); *H01L 21/0262* (2013.01)

(58) Field of Classification Search
CPC ........ C23C 16/45544; C23C 16/45536; C23C 16/5096; C23C 16/45551; C23C 16/46; C23C 16/45519; H01J 37/32715; H01J 37/32091; H01J 37/32568; H01L 21/0262
See application file for complete search history.

(56) References Cited

U.S. PATENT DOCUMENTS

| 4,439,261 A | * | 3/1984 | Pavone | ............. H01L 21/67069 156/345.47 |
| 2001/0019777 A1 | * | 9/2001 | Tanaka | ............... H01J 37/32467 428/472.2 |
| 2006/0177602 A1 | | 8/2006 | Dijon et al. | |
| 2009/0246942 A1 | | 10/2009 | Imaeda et al. | |

(Continued)

OTHER PUBLICATIONS

PCT International Search Report and Written Opinion in PCT/US2019/037655 dated Oct. 16, 2019, 10 pages.

*Primary Examiner* — Yuechuan Yu
(74) *Attorney, Agent, or Firm* — Servilla Whitney LLC

(57) ABSTRACT

Processing chambers with a plurality of processing stations and individual wafer support surfaces are described. The processing stations and wafer support surfaces are arranged so that there is an equal number of processing stations and heaters. An RF generator is connected to a first electrode in a first station and a second electrode in a second station. A bottom RF path is formed by a connection between the a first support surface and a second support surface.

19 Claims, 7 Drawing Sheets

(56) References Cited

U.S. PATENT DOCUMENTS

| | | | |
|---|---|---|---|
| 2010/0186669 A1* | 7/2010 | Shin | H01L 21/67742 |
| | | | 118/719 |
| 2011/0155057 A1* | 6/2011 | Kato | C23C 16/4584 |
| | | | 118/719 |
| 2012/0006489 A1 | 1/2012 | Okita et al. | |
| 2013/0008605 A1 | 1/2013 | Yin et al. | |
| 2013/0157466 A1 | 6/2013 | Fox et al. | |
| 2015/0325434 A1* | 11/2015 | Yamamoto | H01L 21/02321 |
| | | | 438/762 |
| 2015/0361553 A1* | 12/2015 | Murakawa | C23C 16/52 |
| | | | 156/345.55 |

\* cited by examiner

PAIRED DYNAMIC PARALLEL PLATE CAPACITIVELY COUPLED PLASMAS

CROSS-REFERENCE TO RELATED APPLICATIONS

This application claims priority to U.S. Provisional Application No. 62/686,643, filed Jun. 18, 2018, the entire disclosure of which is hereby incorporated by reference herein.

TECHNICAL FIELD

Embodiments of the disclosure generally relate to an apparatus for semiconductor wafer processing. More particularly, embodiments of the disclosure relate to processing chambers with parallel plate capactively coupled plasma and methods of generating plasmas.

BACKGROUND

Atomic Layer Deposition (ALD) and Plasma-Enhanced ALD (PEALD) are deposition techniques that offer control of film thickness and conformality in high-aspect ratio structures. Due to continuously decreasing device dimensions in the semiconductor industry, there is increasing interest and applications that use ALD/PEALD. In some cases, only PEALD can meet specifications for desired film thickness and conformality.

Semiconductor device formation is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

Capacitively Coupled Plasma (CCP) is a well-proven method to generate a uniform plasma and is ideal for many plasma processing applications for semiconductor manufacturing. When one of the electrodes of the CCP, where usually the silicon wafer is placed, needs to physically move immediately before and after or during the processing, the conventional arrangement requires the electrical connection for the grounding path to be disconnected in-situ making implementation nearly impossible.

Therefore, there is a need in the art for apparatus to provide uniform plasma in parallel plate capacitively coupled plasmas for batch processing.

SUMMARY

One or more embodiments of the disclosure are directed to processing chambers comprising at least two plasma stations and wafer pedestal having a plurality of support surfaces to support individual wafers for processing. An RF generator is connected to a first electrode in a first plasma processing station and a second electrode in a second plasma processing station to form a top RF path. There is a connection between at least two support surfaces of the wafer pedestal to form a bottom RF path.

One or more embodiments of the disclosure are directed to processing chambers comprising: a plurality of processing stations arranged around an interior of the processing chamber, the plurality of processing stations comprising at least two plasma stations; a wafer pedestal having a plurality of heaters to support individual wafers for processing, the number of heaters equal to the number of processing stations; an RF generator connected to a first electrode in a first plasma processing station and a second electrode in a second plasma processing station to form a top RF path; and a connection between a first heater and a second heater of the wafer pedestal to form a bottom RF path.

Further embodiments of the disclosure are directed to methods of processing a plurality of substrates. An RF generator connected to a first electrode in a first plasma processing station and a second electrode in a second plasma processing station to form a top RF path is powered. The first plasma processing station comprises a first support surface and the second plasma processing station comprises a second support surface. There is a connection between the first support surface and the second support surface of the wafer pedestal to form a bottom RF path.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
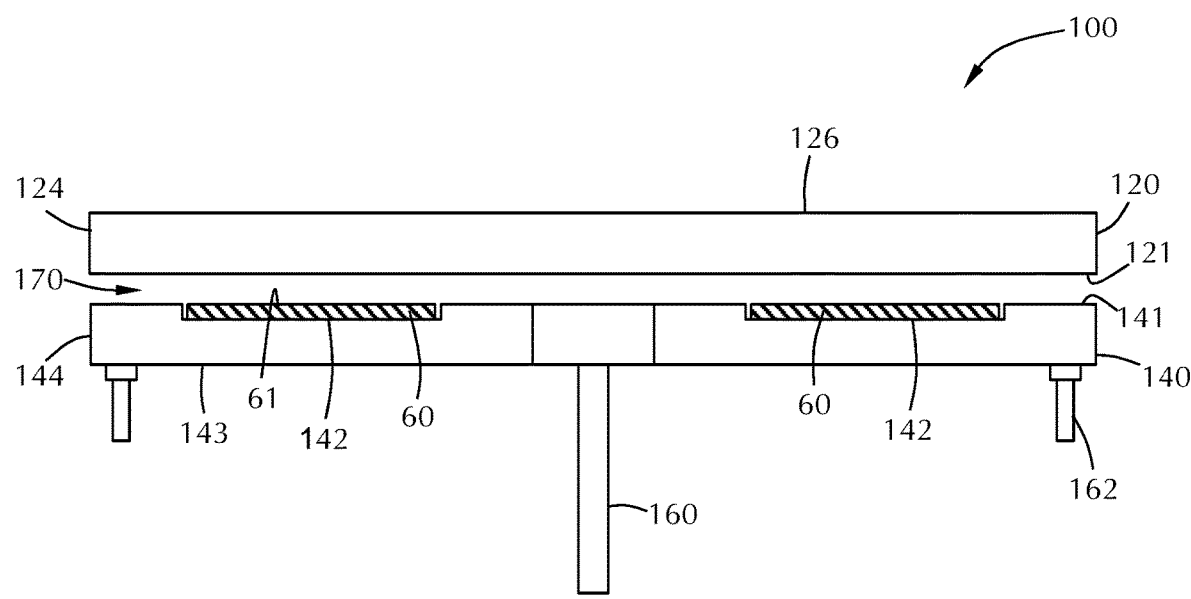
FIG. 1 shows a cross-sectional view of a batch processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

As used in this specification and the appended claims, the terms "reactive compound," "reactive gas," "reactive species," "precursor," "process gas," and the like are used interchangeably to mean a substance with a species capable of reacting with the substrate surface or material on the substrate surface in a surface reaction (e.g., chemisorption, oxidation, reduction). For example, a first "reactive gas" may simply adsorb onto the surface of a substrate and be available for further chemical reaction with a second reactive gas.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

As used in this specification and the appended claims, the terms "pie-shaped" and "wedge-shaped" are used interchangeably to describe a body that is a sector of a circle. For example, a wedge-shaped segment may be a fraction of a circle or disc-shaped structure and multiple wedge-shaped segments can be connected to form a circular body. The sector can be defined as a part of a circle enclosed by two radii of a circle and the intersecting arc. The inner edge of the pie-shaped segment can come to a point or can be truncated to a flat edge or rounded. In some embodiments, the sector can be defined as a portion of a ring or annulus.

The path of the substrates can be perpendicular to the gas ports. In some embodiments, each of the gas injector assemblies comprises a plurality of elongate gas ports which extend in a direction substantially perpendicular to the path traversed by a substrate, where a front face of the gas distribution assembly is substantially parallel to the platen. As used in this specification and the appended claims, the term "substantially perpendicular" means that the general direction of movement of the substrates is along a plane approximately perpendicular (e.g., about 45° to 90°) to the axis of the gas ports. For a wedge-shaped gas port, the axis of the gas port can be considered to be a line defined as the mid-point of the width of the port extending along the length of the port.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial ALD gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. The plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, forming a layer on the substrate surface.

Figure 2:
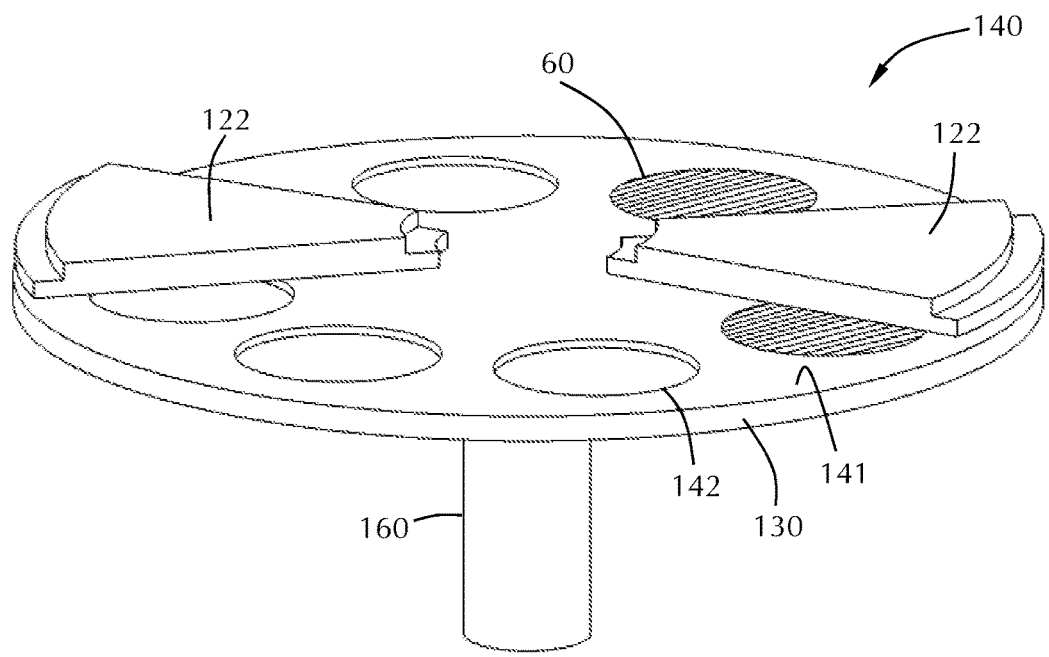
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

The susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm. The recess 142 of some embodiments supports a wafer so that the inner diameter (ID) of the wafer is located within the range of about 170 mm to about 185 mm from the center (axis of rotation) of the susceptor. In some embodiments, the recess 142 supports a wafer so that the outer diameter (OD) of the wafer is located in the range of about 470 mm to about 485 mm from the center (axis of rotation) of the susceptor.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120. In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
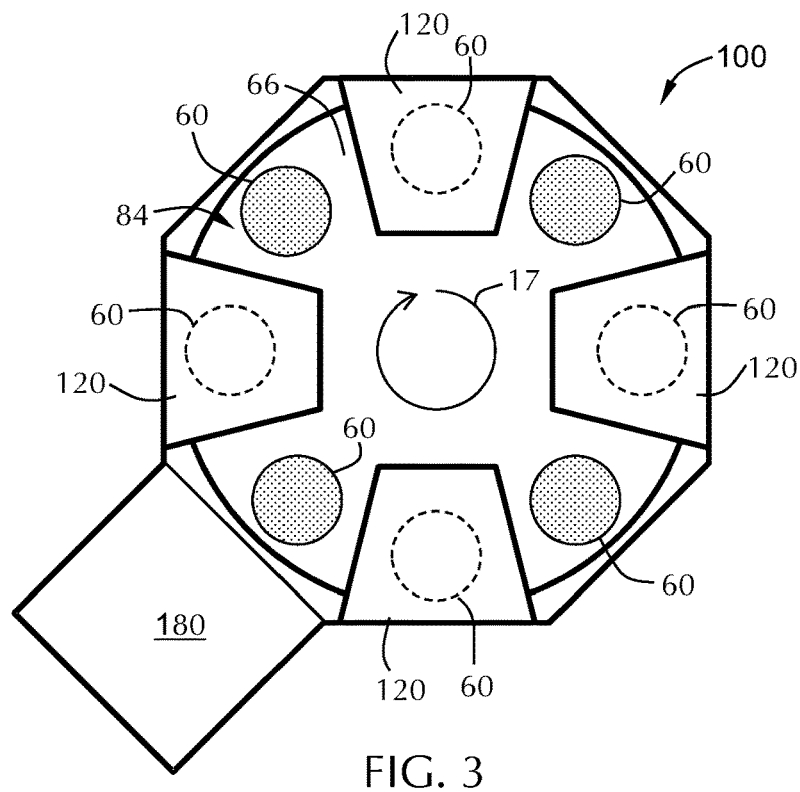
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. With spatial ALD injectors, a film is deposited on the wafer during movement of the wafer relative to the injector assembly. In some embodiments, the susceptor assembly 140 is rotated in increments that prevent the substrates 60 from stopping beneath the gas distribution assemblies 120. The number of substrates 60 and gas distribution assemblies 120 can be the same or different. In some embodiments, there is the same number of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal, however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the processing chamber 100. A wafer robot may be positioned in the chamber 180 to move the substrate onto the susceptor.

Rotation of the carousel (e.g., the susceptor assembly 140) can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
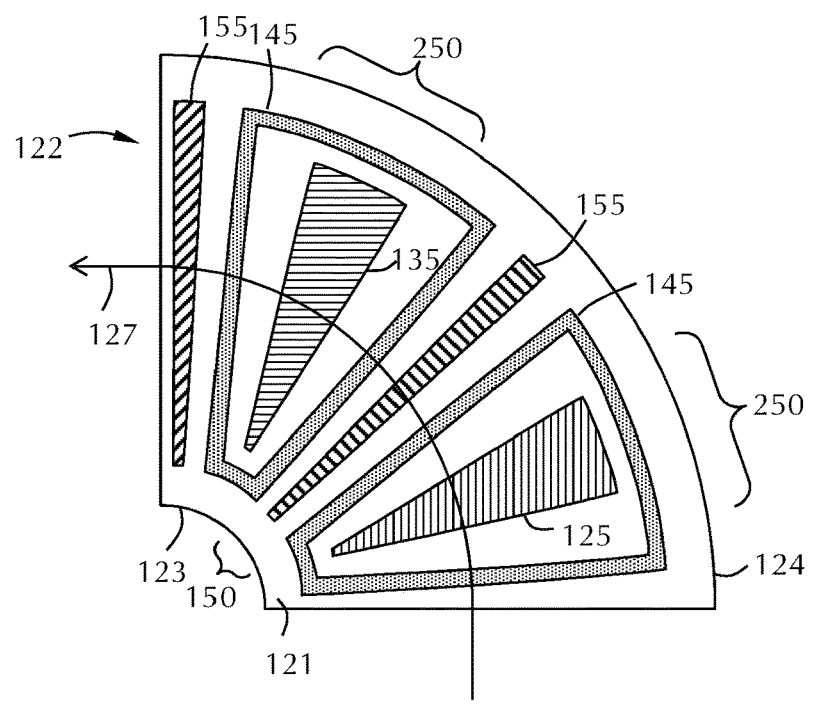
FIG. 4 shows a schematic view of a portion of a wedge shaped gas distribution assembly for use in a batch processing chamber in accordance with one or more embodiment of the disclosure.
Figure 5:
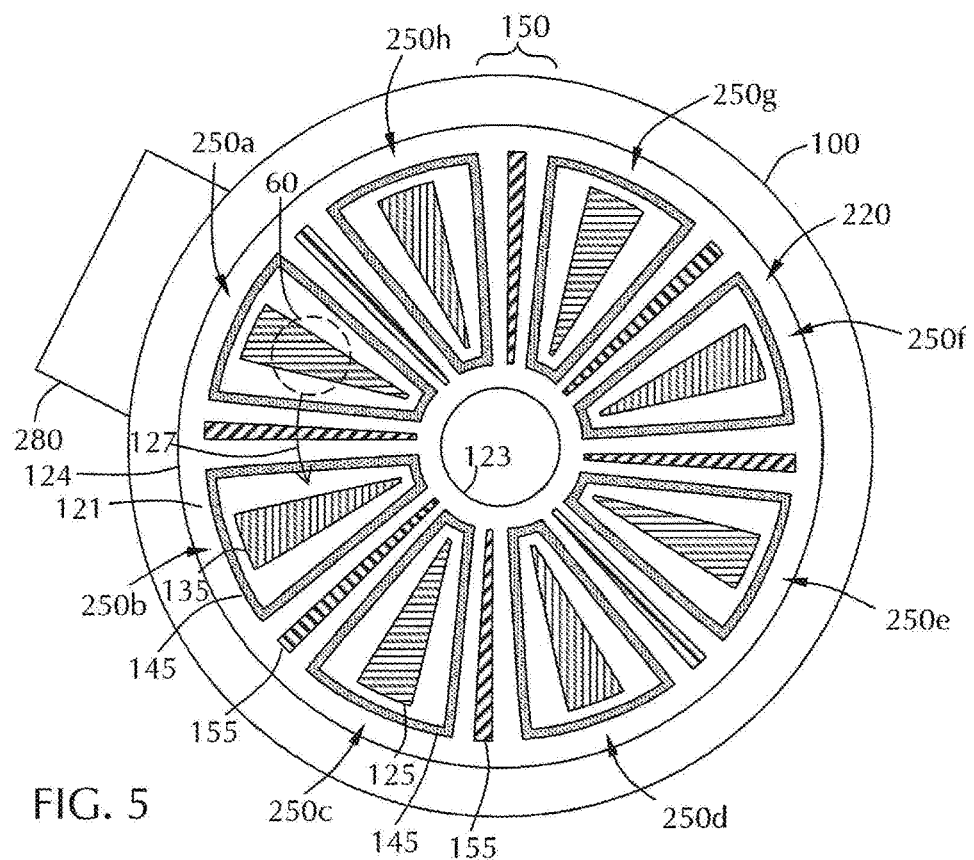
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second reactive gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145 and vacuum ports 155 extend from an area adjacent the inner peripheral edge 123 toward an area adjacent the outer peripheral edge 124 of the gas distribution assembly 220. The plurality of gas ports shown include a first reactive gas port 125, a second reactive gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second reactive gas port 135 and a vacuum port 145. Thus, at the end of the path 127 shown in FIG. 4, the substrate has been exposed to gas streams from the first reactive gas port 125 and the second reactive gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second reactive gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual reactive gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second reactive gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120 (also referred to as a gas distribution plate). The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first processing region 250a through the eighth processing region 250h, including all processing regions between. For each cycle around the processing chamber, using the gas distribution assembly shown, the substrate 60 will be exposed to four ALD cycles of first reactive gas and second reactive gas.

The conventional ALD sequence in a batch processor, like that of FIG. 5, maintains chemical A and B flow respectively from spatially separated injectors with pump/purge section between. The conventional ALD sequence has a starting and ending pattern which might result in non-uniformity of the deposited film. The inventors have surprisingly discovered that a time based ALD process performed in a spatial ALD batch processing chamber provides a film with higher uniformity. The basic process of exposure to gas A, no reactive gas, gas B, no reactive gas would be to sweep the substrate under the injectors to saturate the surface with chemical A and B respectively to avoid having a starting and ending pattern form in the film. The inventors have surprisingly found that the time based approach is especially beneficial when the target film thickness is thin (e.g., less than 20 ALD cycles), where starting and ending pattern have a significant impact on the within wafer uniformity performance. The inventors have also discovered that the reaction process to create SiCN, SiCO and SiCON films, as described herein, could not be accomplished with a time-domain process. The amount of time used to purge the processing chamber results in the stripping of material from the substrate surface. The stripping does not happen with the spatial ALD process described because the time under the gas curtain is short.

Accordingly, embodiments of the disclosure are directed to processing methods comprising a processing chamber 100 with a plurality of processing regions 250a-250h with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250a-250h. The number of gas curtains is generally equal to or greater than the number of processing regions. For example, if region 250a had no reactive gas flow, but merely served as a loading area, the processing chamber would have seven processing regions and eight gas curtains.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250b through processing region 250h, an inert gas would be flowing into processing region 250a. The inert gas can be flowed through the first reactive gas port 125 or the second reactive gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

Figure 6:
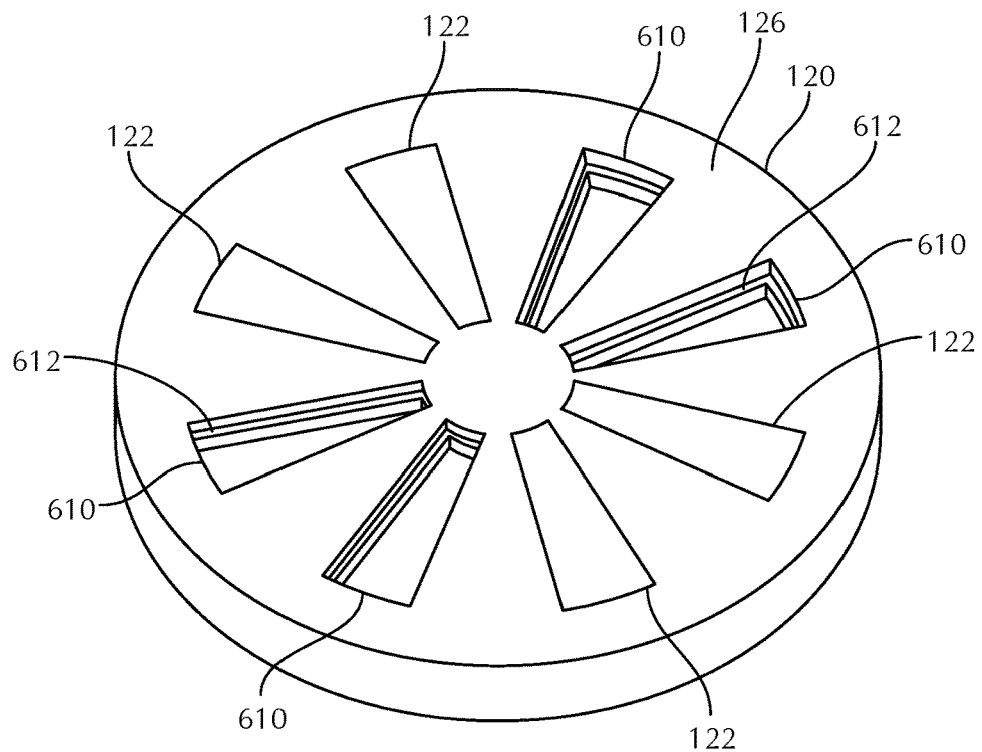
FIG. 6 shows a gas distribution assembly with openings for gas injector inserts in accordance with one or more embodiment of the disclosure.

FIG. 6 illustrates another embodiment of a gas distribution assembly 120 with four injector units 122 and four openings 610. The openings 610 can be occupied by an injector insert (not shown) which will form a uniform component. In some embodiments, the gas distribution assembly 120 has a temperature controlled body. For example, the large illustrated component with four openings 610 and four injector units 122 can be cooled and/or heated using fluid channels or other cooling/heating configurations known to the skilled artisan. The openings 610 illustrated include ledges 612 which are sized to support an injector insert; however this is merely representative one possible configuration and should not be taken as limiting the scope of the disclosure.

Conventional methods and apparatus require a good grounding path for RF current. This precludes using a stage that is physically moving under multiple CCP electrodes. In that case, a counter electrode is provided and the return path in one side of the stage, where the wafer is placed, does not have to be part of the RF return path. This can result in difficulty in creating a uniform plasma (electrical potential and ion density) over the entire wafer.

Some embodiments of the disclosure advantageously provide apparatus with a pair of capacitively coupled plasma (CCP) sources electrically connected in series. Some embodiments advantageously provide CCPs where RF current on one plasma source returns through another plasma source. Some embodiments advantageously provide apparatus and methods to minimize or eliminate external grounding paths for the RF current to return through, making it suitable for a mechanically dynamic plasma chamber where securing a good grounding path is difficult.

Some embodiments of the disclosure advantageously provide apparatus and methods pairing two CCP stages moving together and use one CCP source as the return for the other source. Some embodiments provide apparatus and methods without a complex arrangement of engaging and disengaging of the RF return path.

In some embodiments, two CCP sources are connected in parallel. The bottom RF path is connected with each other. RF power is applied to the top side, 180 degree out of phase from each other, and drives the RF current back and forth in a push-and-pull fashion. The RF current enters in one source, exits the source from the bottom, and comes back to the other source from the bottom and exits from the top electrode of the other source.

The source can be driven by two RF generators operating 180° out of sync, or by one generator that will feed two sides via a balun (coaxial transformer, conventional transformer, etc.). Continuity of the RF current through the two sources will allow improved simultaneous operation of the two sources. The use of a single generator can save the cost of a second generator and match circuit.

Figure 7:
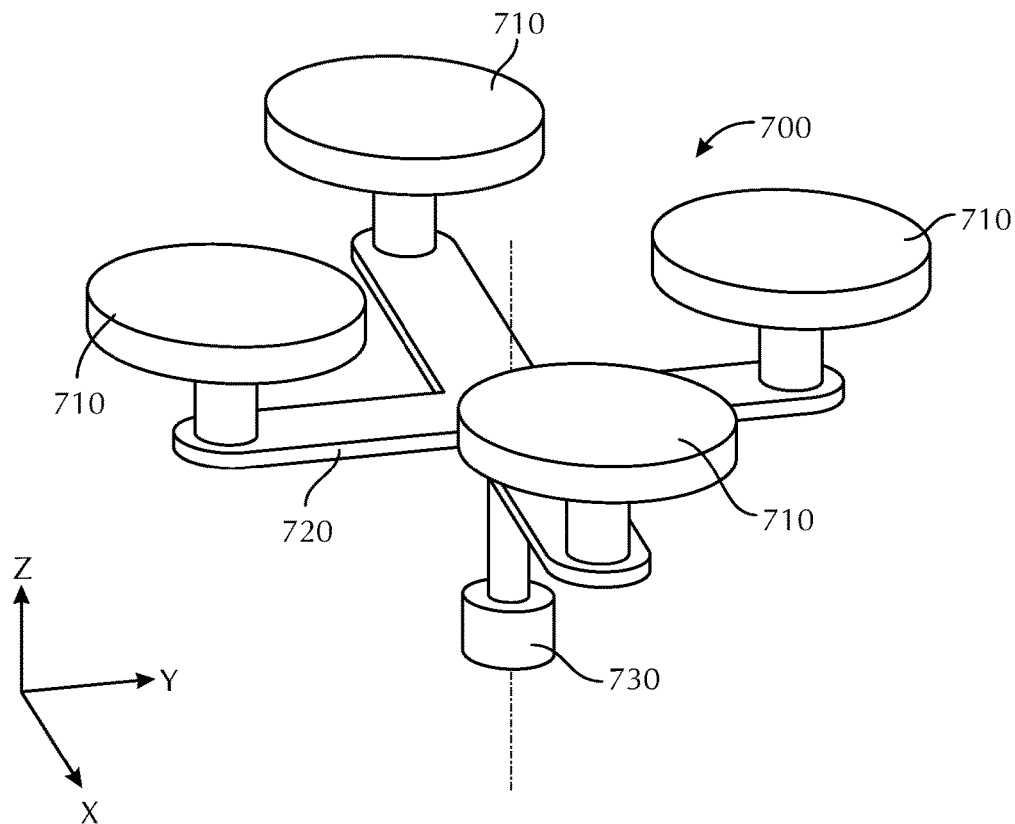
FIG. 7 shows a schematic of a processing chamber in accordance with one or more embodiment of the disclosure.

In the embodiments illustrated in FIGS. 2 and 3, the susceptor is a single conductive body. In some embodiments, as illustrated in FIG. 7, separate substrate supports 710 are used and configured to act like a single wafer pedestal 700. Four separate substrate supports 710 are connected to a cruciform-shaped pedestal base 720. The pedestal base 720 is connected to a motor 730 which can provide one or more of z-axis movement or theta movement (rotation about the z-axis). The illustrated wafer pedestal 700 has four separate substrate supports 710 and an appropriately shaped pedestal base 720; however, the skilled artisan will recognize that there can be any suitable number of substrate supports 710 (e.g., 2, 3, 4, 5, 6, etc.) with an appropriately shaped pedestal base 720.

Each of the substrate supports 710 can be heated/cooled independently of the other substrate supports 710. This allows a wafer on each pedestal to be temperature controlled separately depending on the particular process/reaction occurring at any given location around the z-axis. For example, the processing tool might have four separate processing regions so that each wafer is moved on a pedestal to some or all of the processing regions for multiple reactions and processes.

Figure 8:
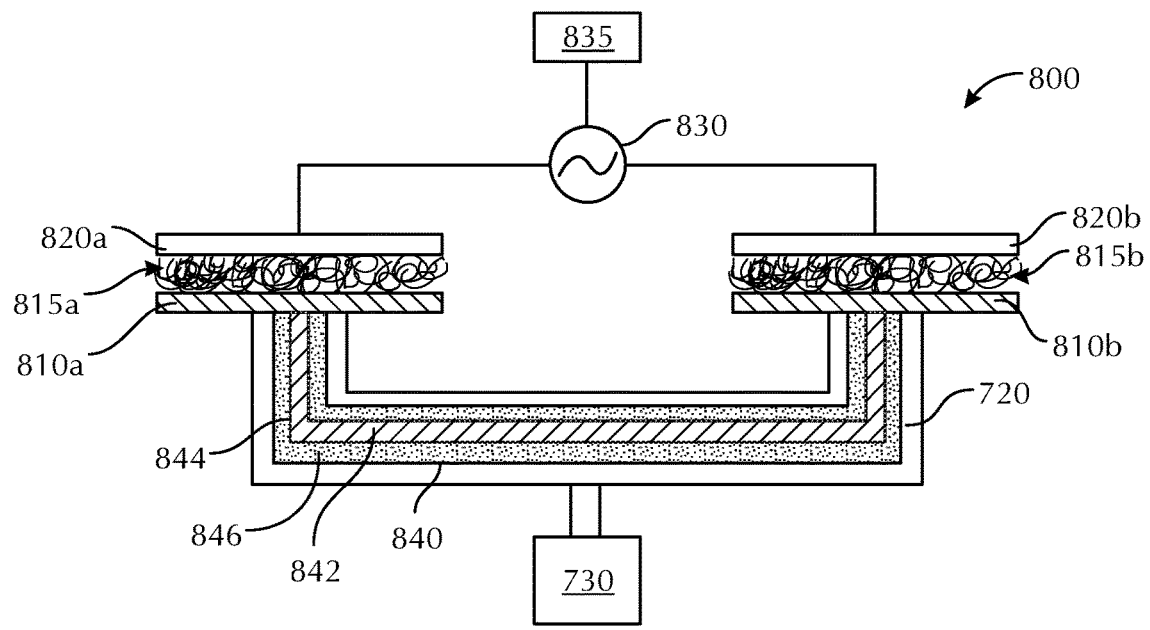
FIG. 8 shows a schematic of a processing chamber in accordance with one or more embodiment of the disclosure.

With reference to FIGS. 8-13, one or more embodiments of the disclosure is directed to processing chambers 800 and methods of providing uniform plasmas. In FIG. 8, a pair of fixed electrodes 820a, 820b and a pair of moving electrodes (show as moving heaters 810a, 810b) can be used as shown in a series circuit. While the illustrated embodiment uses moving heaters, the disclosure is not limited to such apparatus. Generally, the disclosure is directed to methods of generating plasma across two or more sources by connecting the ground paths and coordinating the phases so that a physical ground is not needed. In the embodiment illustrated in FIGS. 6 and 7, there could be two or four plasma injectors (showerheads) where two might be ignited at the same time using the phase coordinating described herein. Plasma 815*a* can be lit between electrode 820*a* and heater 810*a* and another plasma 815*b* is simultaneously lit between electrode 820*b* and heater 810*b*. The heaters 810*a*, 810*b* can then move so that electrode 820*a* and heater 810*b* are paired, and vice versa. The two plasmas can be lit again. The same generator 830 and match set 835 are used to power both the plasmas in series. Without being bound by any particular theory of operation, it is believed that having the two plasmas in series ensures that both plasmas ignite at the same time and the same current is passing through the two pairs of electrodes and, therefore, the two wafers have similar exposures. By alternating between the electrodes and averaging effect is ensured for the two wafers. A coax cable 840 connects the two heater 810*a*, 810*b* electrodes that move with the heaters so there is no relative motion in the physical RF connections. The reduction of the RF components to one generator 830 and one match set 835 reduces cost and complexity while ensuring wafer to wafer matching.

In the embodiment illustrated in FIG. 8, the coax cable 840 is embedded within pedestal base 720. The coax cable 840 can be connected to the heaters and routed in any suitable manner known to the skilled artisan. The coax cable 840 comprises an inner conductor 842 and an outer conductor 846 with an insulator 844 between.

Figure 9:
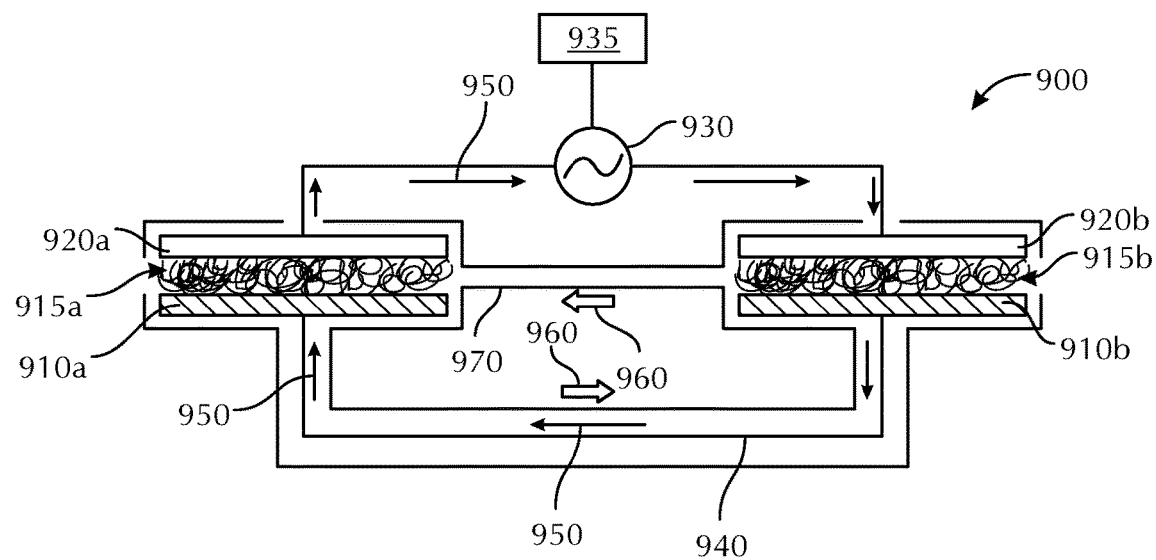
FIG. 9 shows a schematic of a processing chamber in accordance with one or more embodiment of the disclosure.

FIG. 9 shows schematic representation of a processing chamber 900 with substrate supports 910*a*, 910*b* and electrodes 920*a*, 920*b*. The RF source 930 with suitable match circuit 935 is coupled to electrode 920*a* and electrode 920*b*. The substrate supports 910*a*, 910*b* (which in some embodiments are heaters) and coax cable 940 form the bottom portion of the circuit so that current 950 flows in one direction from the RF source 930 back to the RF source 930. The arrows showing the current 950 have a thin line to differentiate between current 950 and image current 960. As the skilled artisan will recognize, the direction of the arrows will change with the oscillations of the RF current.

In the embodiment illustrated, the top RF path (connecting 920*a* to 920*b* through RF generator 930) is an open connection. The bottom RF path (connecting support 910*a* to support 910*b* is completed with a coax cable 940 and a connection 970 to form a full path for image current 960 flow. The RF source 930 is coupled to the electrodes via transformer coupled balun. The balun can be used to convert the output of the generator to a balanced output.

Figure 10:
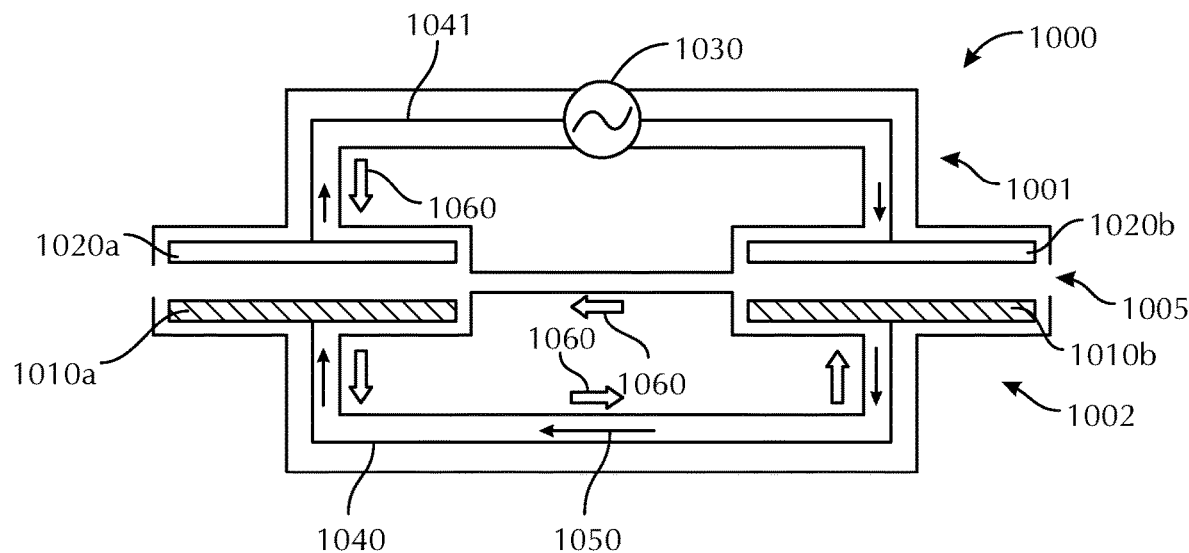
FIG. 10 shows a schematic of a processing chamber in accordance with one or more embodiment of the disclosure.

FIG. 10 shows another embodiment of a processing chamber 1000. Here, coax line 1040 connects the bottom 1002 components (supports 1010*a*, 1010*b*) and coax line 1041 connects the electrodes 1020*a* and 1020*b* through RF generator 1030. The RF current fed to one plasma source (electrode 1020*a*, 1020*b*) will return via the other source. This will create an image current 1060 that can skew the RF fields inside the process area. Using a coaxial path to complete the full circle can help form symmetric current distribution but has current flow 1050 (can be displacement current or reactive current) along the wall and across the gap 1005 between the top 1001 and bottom 1002 of the processing chamber 1000. The gap of some embodiments is in the range of about 0.1 mm to about 5 mm, or in the range of about 0.5 mm to about 2 mm, or about 1 mm.

Figure 11:
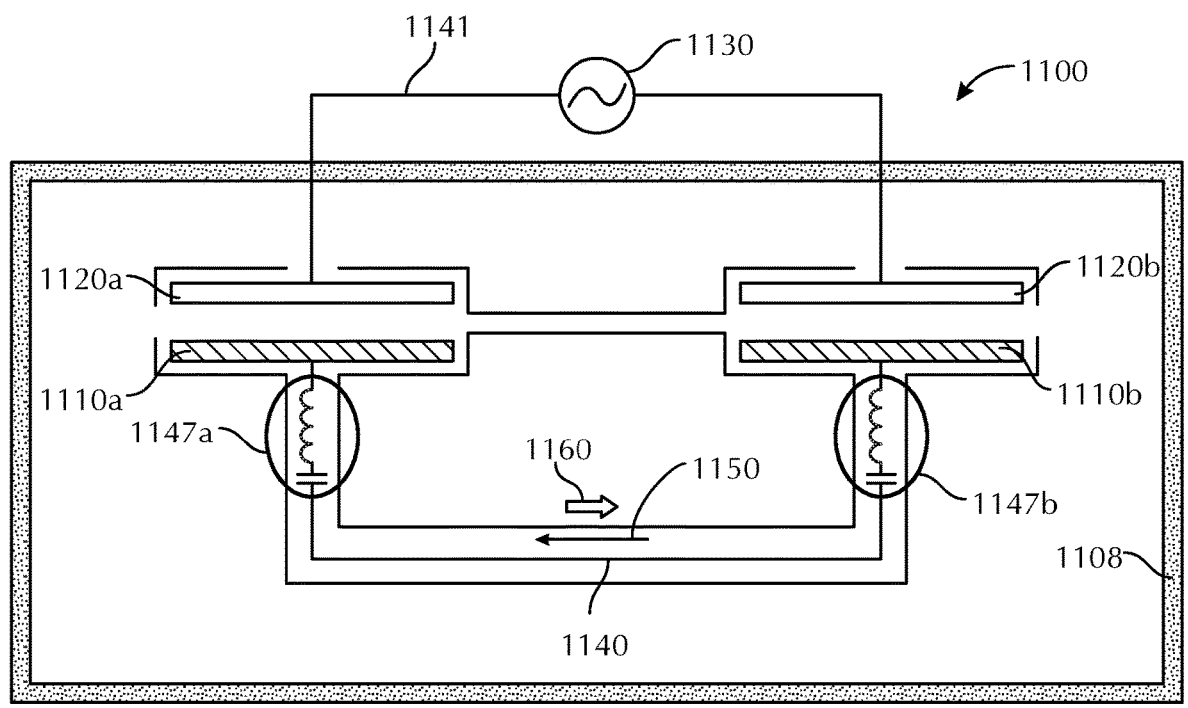
FIG. 11 shows a schematic of a processing chamber in accordance with one or more embodiment of the disclosure.

FIG. 11 shows another embodiment of a processing chamber 1100. Similar to FIG. 9, the embodiment illustrated in FIG. 11 has a coax line 1140 connecting the bottom components (substrate supports 1110*a*, 1110*b*) while an open line 1141 connects the top components (electrode 1120*a*, 1120*b* and RF generator 1130). A coax line could be used to connect the top components as well. Here, a tuning element 1147*a*, 1147*b* is added to bring virtual ground to the electrode. It is believed that this will reduce voltage between the electrodes and the surrounding metal structure 1108 and minimize the chance of initiating discharge in those regions. The tuning elements 1147*a*, 1147*b* reduce the voltage between the pedestal (substrate supports 1110*a*, 1110*b*) and surrounding metal structure 1108 to reduce parasitic plasma.

Figure 12:
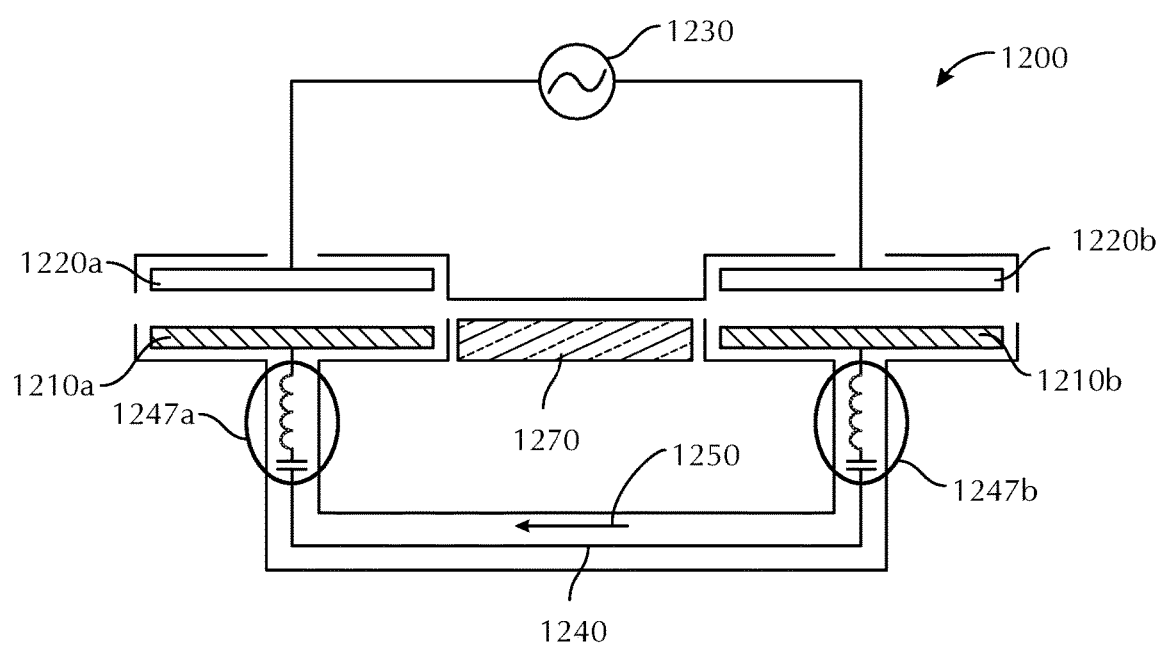
FIG. 12 shows a schematic of a processing chamber in accordance with one or more embodiment of the disclosure.

FIG. 12 shows another embodiment of a processing chamber 1200 with a dielectric break 1270. The top portion of the chamber is connected in a similar manner to that illustrated in FIG. 11. The bottom portion of the chamber differs by inclusion of the dielectric break 1270. Substrate support 1210*a* is connected to substrate support 1210*b* through coax line 1240 with balun 1247*a*, 1247*b*. The dielectric spacer 1270 separates the substrate supports 1210*a*, 1210*b*, reducing image current in the bottom portion of the chamber. Without being bound by any particular theory of operation, it is believed that providing a dielectric break sill eliminate the need for a path along the wall of the chamber. This may result in generation of a voltage differential between the surfaces of the components.

The dielectric break 1270 can be any suitable material known to the skilled artisan. Suitable dielectric materials include, but are not limited to, quartz, ceramic and Teflon® (polytetrafluoroethylene).

Figure 13:
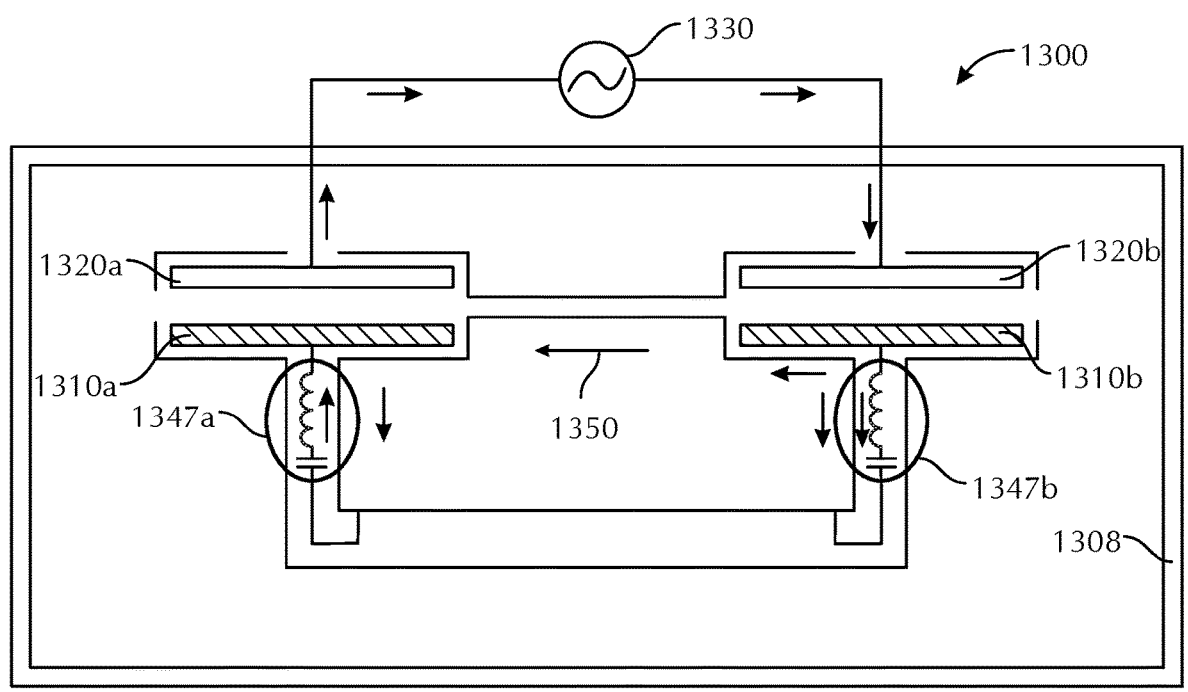
FIG. 13 shows a schematic of a processing chamber in accordance with one or more embodiment of the disclosure.

FIG. 13 shows another embodiment of a processing chamber 1300 with a non-coaxial bottom path. The RF generator 1330 connects electrode 1320*a* with electrode 1320*b*. The bottom path is formed without a coaxial line connecting substrate support 1310*a* with substrate support 1310*b*. The tuning elements 1347*a*, 1347*b* are tied to the outer conductor providing a return path for the image current without a coax line.

Additional embodiments of the disclosure are directed to processing chambers having at least two plasma stations. As used in this manner, a plasma station has an electrode, showerhead or gas distribution system that can be used to generate a plasma. A plasma station can be an isolated region, as in the embodiment of FIGS. 7-8, or separate portions of a batch processing chambers such as the processing chamber illustrated in FIGS. 1-6.

Referring again to FIGS. 8-13, the processing chamber 800 includes a wafer pedestal having a plurality of support surfaces to support individual wafers for processing. In FIG. 8, the support surfaces are illustrated as a pair of moving electrodes (shown as moving heaters 810*a*, 810*b*).

A plasma 815*a* can be lit between the first electrode 820*a* and a first support surface (heater 810*a*) and a plasma 815*b* is simultaneously lit between a second electrode 820*b* and a second support surface (heater 810*b*). The support surfaces (heaters 810*a*, 810*b*) can then move so that first electrode 820*a* and second support surface (heater 810*b*) are paired, and vice versa. The two plasmas can be lit again. The same RF generator 830 and match set 835 are used to power both the plasmas in series. The RF generator 830 is connected to the first electrode 820*a* in the first plasma station and the second electrode 820*b* in the second plasma station to form a top RF path. Without being bound by any particular theory of operation, it is believed that having the two plasmas in series ensures that both plasmas ignite at the same time and the same current is passing through the two pairs of electrodes and, therefore, the two wafers have similar exposures. By alternating between the electrodes and averaging effect is ensured for the two wafers. A coax cable 840 connects the two heater 810*a*, 810*b* electrodes that move with the heaters so there is no relative motion in the physical RF connections. The reduction of the RF components to one generator 830 and one match set 835 reduces cost and complexity while ensuring wafer to wafer matching.

In the embodiment illustrated in FIG. 8, the coax cable 840 is embedded within pedestal base 720. The coax cable 840 can be connected to the at least two support surfaces (e.g., heaters 810a, 810b) of the wafer pedestal to form a bottom RF path. The connections can be routed in any suitable manner known to the skilled artisan including, but not limited to, coaxial (coax) cables. The coax cable 840 comprises an inner conductor 842 and an outer conductor 846 with an insulator 844 between.

Each of the embodiments illustrated in FIGS. 9-13 are applicable to a processing chamber with at least two support surfaces and at least two plasma stations. The arrangement of the components in these illustrations is analgous to the arrangement of components in which a movable heater is replaced with a more generic support surface. The support surface can include a movable heater, but is not limited in this manner.

Additional embodiments of the disclosure are directed to methods of processing a plurality of substrates. The methods comprise powering an RF generator connected to a first electrode in a first plasma processing station and a second electrode in a second plasma processing station to form a top RF path. During powering of the electrodes, a first support surface is located within the first plasma processing station and a second support surface is located in the second plasma processing station. The first support surface and second support surface are connected to form a bottom RF path. The support surfaces can be movable heaters or any other susceptor-type component known to the skilled artisan. In some embodiments, the method further comprises providing a connection between the first electrode and the second electrode and/or a connection between the first support surface and the second support surface, as described above with respect to FIGS. 9-13.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. A processing chamber comprising:
   at least two plasma stations;
   a wafer pedestal having a plurality of support surfaces to support individual wafers for processing;
   an RF generator connected to a first electrode in a first plasma processing station and a second electrode in a second plasma processing station to form a top RF path; and
   a connection between at least two support surfaces of the wafer pedestal to form a bottom RF path,
   wherein the first electrode, the connection between the at least two support surfaces of the wafer pedestal and the second electrode form a path for an RF current flow.

2. The processing chamber of claim 1, wherein the connection between the support surfaces is within the wafer pedestal.

3. The processing chamber of claim 1, wherein the connection between the support surfaces comprises a coaxial connection.

4. The processing chamber of claim 3, further comprising a second bottom RF path connecting the support surfaces.

5. The processing chamber of claim 3, wherein the top RF path is formed with a coaxial cable.

6. The processing chamber of claim 3, further comprising a tuning element connected to each of the support surfaces.

7. The processing chamber of claim 6, wherein the tuning element comprises a balun.

8. The processing chamber of claim 6, wherein the tuning element reduces voltage difference between the support surfaces and a surrounding metal structure forming the processing chamber.

9. The processing chamber of claim 3, further comprising a dielectric spacer separating the support surfaces.

10. The processing chamber of claim 9, wherein the dielectric spacer comprises one or more of quartz, ceramic or polytetrafluoroethylene.

11. The processing chamber of claim 1, further comprising a tuning element connected to each of the support surfaces.

12. The processing chamber of claim 11, wherein the tuning element comprises a balun.

13. The processing chamber of claim 11, wherein the bottom RF path is formed without a coaxial cable.

14. A processing chamber comprising: a plurality of processing stations arranged around an interior of the processing chamber, the plurality of processing stations comprising at least two plasma stations; a wafer pedestal having a plurality of heaters to support individual wafers for processing, the number of heaters equal to the number of processing stations; an RF generator connected to a first electrode in a first plasma processing station and a second electrode in a second plasma processing station to form a top RF path; and a connection between a first heater and a second heater of the wafer pedestal to form a bottom RF paths wherein the first electrode, the connection between the first heater and the second heater of the wafer pedestal and the second electrode form a path for an RF current flow.

15. The processing chamber of claim 14, wherein the connection between the first heater and second heater is within the wafer pedestal.

16. The processing chamber of claim 14, wherein the connection between the first heater and the second heater comprises a coaxial connection.

17. The processing chamber of claim 16, further comprising a second bottom RF path connecting the first heater to the second heater.

18. The processing chamber of claim 16, further comprising a tuning element connected to each of the first heater and second heater.

19. The processing chamber of claim 16, further comprising a dielectric spacer separating the first heater from the second heater.

* * * * *